(12) United States Patent
Chaloux et al.

(10) Patent No.: US 6,194,736 B1
(45) Date of Patent: Feb. 27, 2001

(54) QUANTUM CONDUCTIVE RECRYSTALLIZATION BARRIER LAYERS

(75) Inventors: Susan E. Chaloux, Wappingers Falls; Tze-Chiang Chen, Yorktown Heights; Johnathan E. Faltermeier, LaGrange; Ulrike Gruening; Rajarao Jammy, both of Wappingers Falls; Jack A. Mandelman, Stormville; Christopher C. Parks, Beacon; Paul C. Parries, Wappingers Falls; Paul A. Ronsheim, Hopewell Junction; Yun-Yu Wang, Poughquag, all of NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/213,674

(22) Filed: Dec. 17, 1998

(51) Int. Cl.$^7$ ........................................ H01L 29/06
(52) U.S. Cl. ........................ 257/9; 257/30; 257/301; 257/305; 438/243
(58) Field of Search ................. 257/301, 302, 257/303, 304, 305, 30, 9, 12, 14; 438/243, 244, 245, 246, 248

(56) References Cited

U.S. PATENT DOCUMENTS

| | | | |
|---|---|---|---|
| 4,935,804 | 6/1990 | Ito et al. | 357/71 |
| 5,051,786 | 9/1991 | Nicollian et al. | 357/4 |
| 5,065,225 | 11/1991 | Bryant et al. | 357/71 |
| 5,138,425 | 8/1992 | Ichikawa | 357/67 |
| 5,194,397 | 3/1993 | Cook et al. | 437/31 |
| 5,283,453 | 2/1994 | Rajeevakumar | 257/304 |
| 5,376,593 | 12/1994 | Sandhu et al. | 437/242 |
| 5,395,786 | 3/1995 | Hsu et al. | 437/52 |
| 5,434,109 | 7/1995 | Geissler et al. | 437/239 |
| 5,489,544 | 2/1996 | Rajeevakumar | 437/52 |
| 5,512,767 | 4/1996 | Noble, Jr. | 257/301 |
| 5,543,348 | * 8/1996 | Hammerl et al. | 437/60 |
| 5,576,566 | 11/1996 | Kenney | 257/301 |
| 5,648,861 | 7/1997 | Natsuhori | 349/116 |
| 5,656,535 | 8/1997 | Ho et al. | 438/386 |
| 5,677,219 | 10/1997 | Mazure et al. | 437/52 |
| 5,844,266 | * 12/1998 | Stengl et al. | 257/301 |
| 6,087,694 | * 7/2000 | Ohno et al. | 257/306 |

* cited by examiner

Primary Examiner—Sara Crane
(74) Attorney, Agent, or Firm—Steven Capella

(57) ABSTRACT

Reduced scale structures of improved reliability and/or increased composition options are enabled by the creation and use of quantum conductive recrystallization barrier layers. The quantum conductive layers are preferably used in trench capacitors to act as recrystallization barriers.

31 Claims, 4 Drawing Sheets

QUANTUM CONDUCTIVE RECRYSTALLIZATION BARRIER LAYERS

BACKGROUND OF THE INVENTION

In construction of microelectronic devices, it is well known that there is a constant pressure for reduction of device size and/or increase of device capability at a given scale.

In the actual construction of reduced scale devices, attention must be paid to higher precision in configuring the materials from which the device components are formed. Attention must also be paid to the interaction of the various materials used in device construction during the device manufacture process, during device testing, and during device operation. In this regard, finer sized device components are more sensitive to adverse materials interactions since the amount of material forming the component is smaller. For example, an interaction that might have only affected the border area of a large component would affect an entire component of smaller scale (e.g., where the scale of the smaller component is the same size as the border area of the larger component). Thus, reduction in component scale forces consideration of materials interaction problems which could have been viewed as non-critical for larger scale components.

In the context of devices such as deep trench capacitors in semiconductor substrates, the various materials used to form the components of the capacitor such as the capacitor plates (electrodes), the dielectric barrier between electrodes, oxide collar structures to prevent or minimize parasitic effects, surface or buried straps to provide contact between the capacitor and the other circuitry of the device, etc. For example, the electrode in the trench is typically a highly doped polycrystalline silicon (polysilicon) material, the buried or surface strap is typically an amorphous silicon, and the semiconductor substrate is a monocrystalline silicon. The successful functioning of the capacitor depends in part on the ability of these diverse materials to maintain their original or desirably modified character during manufacture/ useful life of the device.

Unfortunately, the nature of these materials is such that unwanted interactions may occur unless otherwise prevented.

For example, a problem may be caused by the difference in crystallinity (or grain size) between the monocrystalline silicon substrate and the amorphous or polycrystalline silicon trench electrode material, especially where there is an intervening amorphous silicon material. In such configurations, the amorphous or polysilicon layer may template on the monocrystalline surface and recrystallize. Often, defects are created at the interface with the monocrystalline silicon during recrystallization which may propagate into the monocrystalline silicon. The occurrence of such defects is believed to adversely affect memory cell performance (the memory cell containing the capacitor). Specifically, the defects are believed to cause a lack of predictability of the charge retention time for the capacitor (so-called variable retention time). Such lack of predictability may limit the usefulness of the resulting device and/or the ability to maximize design performance.

Thus, there is a desire for improved capacitor structures which allow better control of materials interactions to enable construction of reliable reduced scale devices. It is also desired to meet these needs in an economical manner that minimizes or avoids compromise of other device or component properties.

SUMMARY OF THE INVENTION

The invention provides technology which enables reduced scale capacitor structures of improved reliability. More specifically, the invention enables these benefits by the creation and use of quantum conductive barrier layers between regions of differing degrees of crystallinity (or differing grain size).

In one aspect, the invention encompasses a deep trench capacitor in a monocrystalline semiconductor substrate, the capacitor (i) comprising a buried plate in the substrate about an exterior portion of a trench in the substrate, (ii) a node dielectric about at least a lower interior portion of the trench, (iii) an electrode in the trench, and (iv) a conductive strap extending away from the trench electrode, at least a portion of the conductive strap being electrically connected to the trench electrode and the monocrystalline substrate, the capacitor further comprising (v) a quantum conductive barrier layer between the monocrystalline substrate and the trench electrode.

In another aspect, the invention encompasses structures having regions of similar composition (e.g., differing only by amount of dopant or by dopant composition, or having essentially no difference in composition), but differing degrees of crystallinity (or differing average grain size), separated by a quantum conductive dielectric barrier layer. Preferably, a region on one side of the layer is amorphous or monocrystalline whereas a region on the other side of the layer is polycrystalline.

In another aspect, the invention encompasses methods of making trench capacitors containing quantum conductive layers, the methods comprising reacting a silicon surface with a nitrogen compound to form a thin silicon nitride compound layer.

In another aspect, the invention encompasses methods of making trench capacitors containing quantum conductive layers, the methods comprising depositing by chemical vapor deposition, physical vapor deposition or sputtering, a material layer which is sufficiently thin to be quantum conductive, the material being a dielectric in bulk form.

Preferred quantum conductive layers are silicon nitride compounds such as silicon nitride or silicon oxynitride.

These and other aspects of the invention are described in further detail below.

DETAILED DESCRIPTION OF THE INVENTION

The invention provides quantum conductive barrier layers which are useful in control of stresses (e.g., associated with phase, lattice or thermal expansion mismatch, recrystallization or phase transformation) or other driving forces. The invention encompasses structures where such a quantum conductive layer is formed at an interface between two regions which form part or all of a contiguous body (e.g. a portion of a semiconductor device). The barrier layer may provide a benefit in one of the regions immediately adjacent to the interface and/or may provide a benefit in a contiguous region not directly located at the interface.

The invention provides trench capacitor structures containing one or more quantum conductive barriers at locations within the structure (i) between the strap and the monocrystalline substrate, and/or (ii) between the strap and the trench electrode.

The quantum conductive layers of the invention are very thin films of materials which in their bulk properties would be considered dielectrics (i.e., electrical insulators). In very thin layers, however, these materials become electrically conductive. Advantageously, these thin layers have the ability to prevent or reduce transmission of forces associated with recrystallization from one side of the layer to the other. The bulk resistivity (measured in a thick section at 25° C.) of the materials used to make up the quantum conductive layers of the invention is preferably at least about $10^6$ ohm-m, more preferably at least about $10^8$ ohm-m, most preferably at least about $10^{11}$ ohm-m.

The quantum conductive layers preferably have a thickness of about 50 Å or less, more preferably about 5–30 Å, most preferably about 5–15 Å. The resulting films preferably have a film resistance of less than about 1 K-ohm-$\mu m^2$, more preferably less than about 100 ohm-$\mu m^2$. The series resistance introduced by the quantum conductive layer is equal to the film resistance (ohm-$\mu m^2$) divided by the cross sectional area ($\mu m^2$) of the quantum conductive layer normal to the direction of current.

The quantum conductive layers of the invention are preferably substantially uniform, however some variation in thickness may be permissible. Preferably, the layer thickness is kept in a range permitting the quantum conductive effect to take place for all points on the layer while performing the desired barrier function.

Preferred quantum conductive materials are inorganic oxides or nitrides, more preferably silicon nitride compounds selected from the group consisting of silicon nitride or silicon oxynitride. These compounds may be stoichiometric or non-stoichiometric. Alternatively, other ceramic materials such as, for example, alumina, germanium oxide, yttria-stabilized zirconia, or other forms of zirconia may also be used. The layer composition may be determined by secondary ion mass spectroscopy (SIMS) or other suitable technique.

Figure 1:
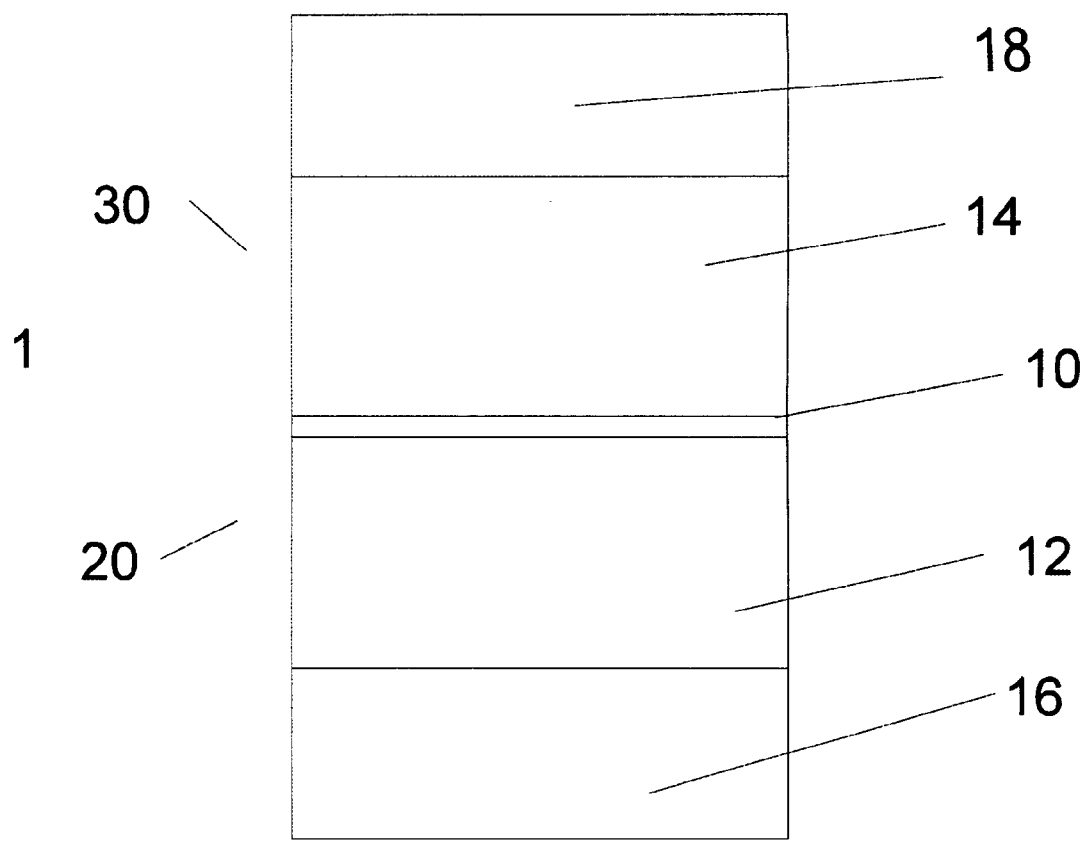
FIG. 1 is a schematic cross section of a structure having contiguous regions with a quantum conductive layer according to the invention.

In the broadest sense, the invention encompasses structures wherein the quantum conductive layer intervenes between two regions having differing degrees of crystallinity or differing average grain size. Turning to FIG. 1, the quantum conductive layer 10, is preferably coextensive with at least one bordering region 12. While the layer 10 is illustrated in FIG. 1 as being coextensive with one region on each side, it should be understood that the invention includes other structures where the layer is coextensive with a plurality of regions on one side of the layer. Also, the layer 10 may be coextensive with regions on both sides, as shown in FIG. 1, or just with the region(s) on one side. The quantum conductive layer 10 is preferably continuous.

In FIG. 1, the relative thickness of quantum conductive layer 10 has been exaggerated for ease of illustration. Structure 1 contains regions 12 and 16 on a first side 20 of quantum conductive layer 10 and regions 14 and 18 on the second side 30 of layer 10. Preferably, the structure is such that at least one on first side 20 differs from at least one region on second side 30 either in (a) average grain size or (b) degree of crystallinity. The quantum conductive layers of the invention preferably act to control the effect of such differences between the regions on one side of the layer and the regions on the other side over the thermal history experienced by the structure.

Thus, the quantum conductive layers of the invention may be used to prevent or hinder forces associated with recrystallization of a region (e.g., region 12) from inducing changes in the crystallinity or crystal structure of regions 14 or 18 on the other side of layer 10. For example, if region 12 were a polycrystalline silicon and region 18 were a monocrystalline silicon, quantum conductive layer 10 could be used to prevent or inhibit stresses associated with recrystallization of region 12 (e.g., as might occur in thermal processing of the overall structure 1) from being transmitted to monocrystalline region 18 where those stresses could cause an undesired propagation of defects in the monocrystalline structure.

While the invention is not limited to any specific compositional makeup for the regions of the structure bordering or contiguous with the quantum conductive layer, preferably, at least one of the regions directly contacting the quantum conductive layer is a silicon material selected from the group consisting of monocrystalline silicon, amorphous silicon or polycrystalline silicon. The silicon material may be doped or undoped. A typical example structure might have a polycrystalline silicon on one side of the layer and an amorphous or monocrystalline silicon region on the other side.

The quantum conductive layers of the invention are especially useful in trench capacitor structures. Examples of typical trench capacitor structures are shown in U.S. Pat. Nos. 5,283,453; 5,395,786; 5,434,109; 5,489,544; 5,512,767; 5,576,566; 5,656,535; and 5,677,219, the disclosures of which are incorporated herein by reference. The trench capacitor structures of the invention are not limited to any specific configuration.

Figure 2:
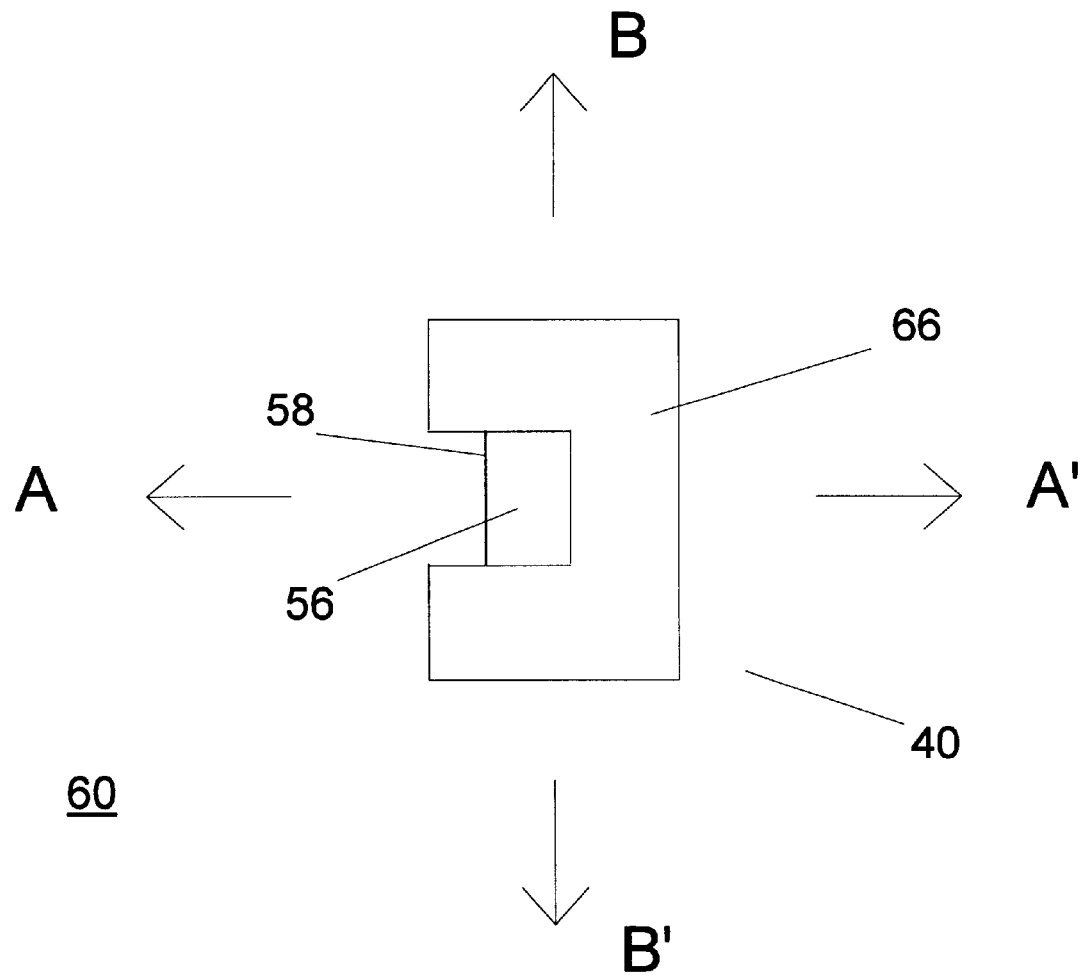
FIG. 2 is a schematic plan view of a deep trench capacitor taken from trench top level with the buried strap exposed.

FIG. 2 shows a schematic plan view of a typical trench capacitor structure 40 taken at the top of the trench in substrate 60 with the buried strap 56 exposed to reveal interface 58 between substrate 60 and strap 56. Shallow trench isolation (STI) 66 surrounds the top area of capacitor 40 on three sides.

Figure 3:
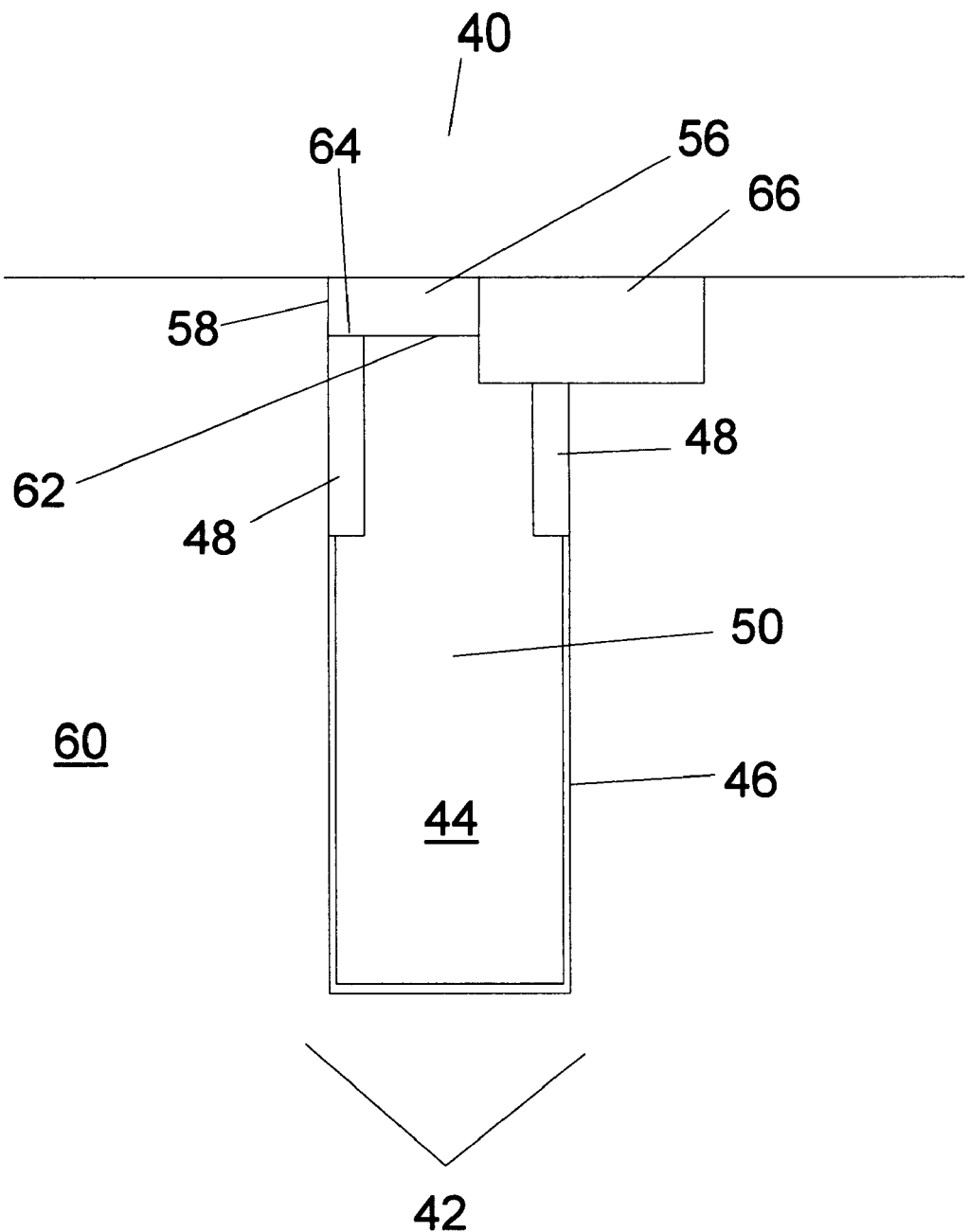
FIG. 3 is a schematic cross section of the deep trench capacitor structure of FIG. 2 at line A—A'.
Figure 4:
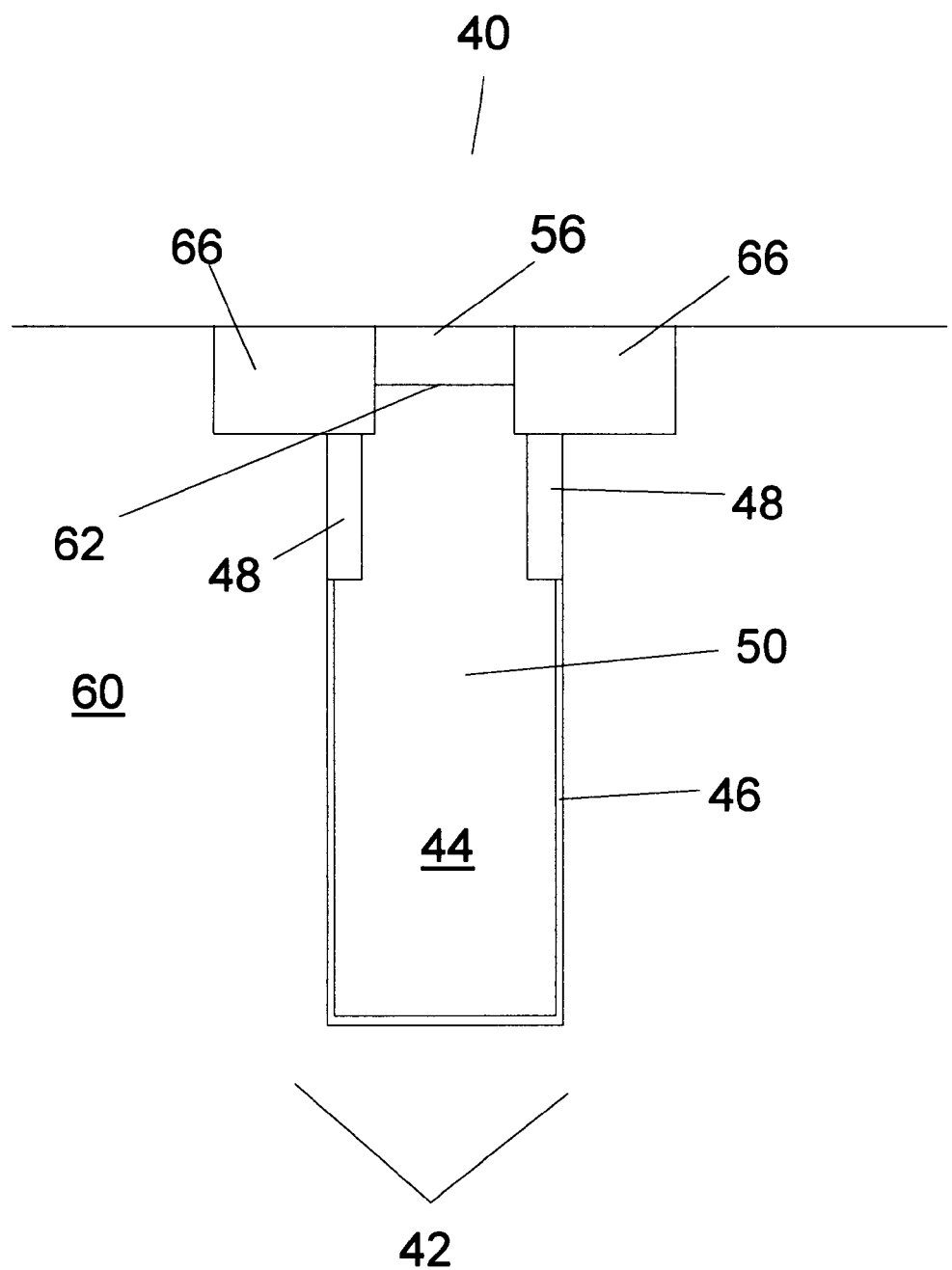
FIG. 4 is a schematic cross section of the deep trench capacitor structure of FIG. 2 at line B—B'.

FIG. 3 shows a schematic side view of the trench capacitor of FIG. 2. A buried plate electrode 42 is located about the exterior of a lower portion of the trench 44. A node dielectric 46 is present about the lower portion of the interior of trench 44. About the upper interior of trench 44 is an oxide collar 48. Trench 44 is filled with a conductive trench electrode material 50. A conductive strap 56 resides over and is electrically connected to trench electrode 50. Strap 56 thus provides electrical access to capacitor 40. While FIGS. 2–4 show a buried strap, the invention is not limited to any specific strap configuration. For example, the invention is equally applicable in the context of surface straps, lip straps (e.g., as disclosed in U.S. patent application Ser. No. 09/105739, filed on Jun. 26, 1998, the disclosure of which is incorporated herein by reference) or other strap configurations.

The quantum conductive layers of the invention may be located at one or more locations within the trench capacitor structure as desired to prevent unwanted interactions. For example, a quantum conductive layer may be located at interface 58 between conductive strap 56 and substrate 60. Such a quantum conductive layer would be useful in preventing or inhibiting undesired transmission of recrystallization forces from strap 56 and/or trench electrode 50 to substrate 60. A quantum conductive layer may also be located at interface 62 between trench electrode 50 and strap 56. Such a quantum conductive layer would also be useful in preventing or inhibiting undesired transmission of recrystallization forces from trench electrode 50 to strap 56 and substrate 60. A side-effect of the use of the quantum conductive layers of the invention may be an inhibition of dopant diffusion from one side of the barrier layer to the other.

The invention encompasses trench capacitor structures where quantum conductive layers are located at one or more of the interfaces described above and/or at other locations within the capacitor structure as desired. Where the quantum conductive layer is formed by chemical vapor deposition, physical vapor deposition or sputtering, the layer may also optionally be present at the interface 64 between collar oxide 48 and strap 56.

The composition and physical characteristics of the quantum conductive barriers used in the trench capacitors of the invention are preferably those described above with regard to general structures incorporating quantum conductive barriers. Advantageously, the quantum conductive layers can perform the desired barrier function without adversely affecting the electrical performance of the trench capacitor.

The invention is not limited to any specific material compositions for the various components of the trench capacitor. If desired, materials described in the art may be used. Thus, the trench electrode 50 would typically be made of a doped polycrystalline silicon or other suitably conductive material. Strap 56 would typically be made of amorphous silicon. Substrate 60 would typically be a monocrystalline semiconductor material (most typically silicon, lightly doped silicon or silicon having lightly doped bands). The buried plate 42 is typically a high dopant (e.g., arsenic) region within the substrate. The collar 48 and shallow trench isolation 66 are typically a silicon dioxide.

The use of alternative or modified materials may be enabled by the presence of the quantum conductive barriers of the invention. For example, trench electrode materials having very high dopant levels may be used (e.g., $5 \times 10^{18}$–$10^{21}$, more preferably $5 \times 10^{19}$–$10^{20}$ dopant atoms per $cm^3$). Alternative trench electrode materials (e.g., silicides, conductive metal nitrides, etc.) may also be used in place of conventional doped polysilicon. The composition of the strap may also be altered in the presence of suitable quantum conductive barrier layers.

While the quantum conductive layers of the invention are especially useful in trench capacitor structures, it should be understood that the layers may be used in other integrated circuit components where very thin conductive barrier layers are desired to prevent transmission of recrystallization forces.

The quantum conductive layers of the invention may be made by various methods. The choice of method may depend on the composition of the surface on which the layer is to be formed and/or the desired quantum conductive layer composition.

Where the surface on which the layer is to be formed has a high silicon content (e.g., a conventional (doped or undoped) polycrystalline, amorphous or monocrystalline silicon), the quantum conductive layer is preferably formed by reacting a portion of the silicon at the immediate surface with a nitrogen-containing compound in the atmosphere contacting the surface. Preferred nitrogen-containing compounds are those which are easily handled in a gaseous state. Examples of preferred nitrogen compounds are selected from the group consisting of ammonia, NO, $N_2O$ or (under plasma conditions) monatomic nitrogen. Ammonia is the most preferred nitrogen compound. The atmosphere may also contain one or more diluent gases such as $N_2$, helium or argon. The partial pressure of the nitrogen compound is preferably about 1–760 Torr, more preferably about 5–10 Torr. The reaction is typically facilitated by heating to a temperature of about 300–950° C., more preferably about 350–750° C. The reaction may be conducted until the desired layer thickness is formed. Preferably, the reaction is conducted for about 1–30 minutes, more preferably about 10–20 minutes. The reaction is typically self-limiting under these conditions.

If desired, the substrate may be precleaned by a chemical etch (e.g. HF solution and/or by a high temperature (e.g., about 900°–1000° C.) bake in a hydrogen atmospher (or other appropriate reducing atmosphere) to remove some or all of any pre-existing oxide surface layer. The techniques described in U.S. Pat. No. 5,194,397 may also be used to control the presence of oxide film. Other known methods for removal of residual films may also be used where appropriate.

Where an oxynitride quantum conductive layer is desired, the above nitrogen reaction process may be conducted with a substrate having a pre-existing very thin oxide layer. In such instances, the relative contents of oxygen and nitrogen in the quantum conductive layer can be controlled by the temperature and time of the nitrogen compound reaction, with higher temperatures and longer reaction times giving a more nitrogen-rich layer. Alternatively, if desired, oxynitride layers may be formed by introducing a very minor amount of oxygen into the nitrogen compound-containing atmosphere. In general, this method is generally less preferred since control of the oxygen content and/or layer thickness may be difficult.

Where reaction of the underlying surface is not desired or not practical, the quantum conductive layer may be formed by chemical vapor deposition, physical vapor deposition or sputtering. In such instances, the reactants for forming the quantum conductive layer may be those typically used to form thin film layers of the corresponding dielectric material, however the reaction conditions (time, temperature, pressure) and/or proportions of the reactants must be appropriately reduced to avoid deposition of an excessively thick film. See for example the process for forming germanium oxide thin films described in U.S. Pat. Nos. 5,648,861 and 5,051,786, the disclosures of which are incorporated herein by reference. Alternative methods for forming the desired thin films may be found in the "Handbook of Thin Film Technology" by Maissel & Glang, McGraw-Hill Book Co. (1970) and in similar treatises.

Trench capacitor structures containing the quantum conductive layers of the invention may be formed by inserting one of the above layer formation techniques at an appropriate point(s) in the overall process of capacitor manufacturing process. The overall trench capacitor manufacturing process used may be any of those known in the art such as those described in the patents mentioned above. Alternatively, other variations on trench capacitor manufacturing processes may also be used (e.g., processes involving formation of collar oxides by the LOCOS technique).

One method of forming a deep trench capacitor in a monocrystalline semiconductor substrate, with quantum conductive layers at both the interface of the strap and the substrate and the interface of the strap and the trench electrode, comprises:

(a) providing a monocrystalline semiconductor substrate having (i) a buried plate about an exterior portion of a trench in the substrate, (ii) a node dielectric about at least a lower interior portion of the trench, and (iii) an electrode in the trench, (b) removing an upper portion of the electrode to provide space for a conductive strap, thereby exposing electrode and substrate surface, (c) reacting the exposed surface of the electrode and the substrate about the space with a nitrogen compound to form a quantum conductive layer on the electrode and substrate surfaces, and (d) filling the space over the quantum conductive layer with a conductive strap material.

Preferably, a collar oxide is provided about the upper interior portion of the trench in step (a). Shallow trench isolation would typically be formed after filling step (d) by etching to define a space for the isolation and filling that space with the desired shallow trench isolation material. Where formation of the quantum conductive layer(s) by reaction with the underlying surface is not desired, the quantum conductive layer may be formed by processes where chemical vapor deposition, physical vapor deposition, sputtering or other appropriate deposition technique is substituted for reacting step (c).

Where a quantum conductive layer is desired only at the interface of the strap and the trench electrode, a mask layer may be directionally deposited (e.g., by HDP deposition) over the layer formed in step (c) whereby the mask is thicker over the quantum conductive layer on the trench electrode surface. This mask may be removed from the quantum conductive layer on the substrate surface by isotropic etching (with partial reduction in thickness of the mask over the quantum conductive layer on the trench electrode surface. The quantum conductive layer on the substrate surface is then preferably removed by a selective isotropic etch to re-expose the substrate surface first exposed in step (b). The remaining mask over the quantum conductive layer on the trench electrode surface may then by removed by a further selective etch process. The process could then continue with filling step (d).

Alternatively, a deep trench capacitor according to the invention with a quantum conductive layer at the interface of the strap and the trench electrode may be formed by:

(a) providing a monocrystalline semiconductor substrate having (i) a buried plate in an exterior portion of trench in the substrate, (ii) a node dielectric about at least a lower interior portion of the trench, and (iii) an electrode in the trench, (b) removing an upper portion of the electrode to provide space for a conductive strap, thereby exposing electrode and substrate surface, (c) directionally depositing a thin dielectric material layer on the electrode surface, (d) isotropically etching the thin dielectric material layer to remove any dielectric material deposited on the exposed substrate surface, thereby leaving a quantum conductive layer on the electrode surface only, and (e) filling the space formed in step (b) with a conductive strap material.

Preferably, a collar oxide is provided about the upper interior portion of the trench in step (a). Shallow trench isolation would typically be formed after filling step (e) by etching to define a space for the isolation and filling that space with the desired shallow trench isolation material.

Where a surface strap is used, the above processes would be modified by eliminating steps for forming space for the buried strap. Where a trench capacitor formation process does not naturally provide the surface where a quantum barrier is desired, such a process can be modified by adding appropriate etch back, layer formation and fill steps, the etch and fill steps being selected from those known in the art for the specific materials involved.

What is claimed is:

1. A deep trench capacitor in a monocrystalline semiconductor substrate, said capacitor (i) comprising a buried plate in said substrate about an exterior portion of a trench in said substrate, (ii) a node dielectric about at least a lower interior portion of said trench, (iii) an electrode in said trench, and (iv) a conductive strap extending away from said trench electrode, the conductive strap being electrically connected to the trench electrode and the monocrystalline substrate, said capacitor further comprising (v) a quantum conductive barrier layer between said monocrystalline substrate and said trench electrode.

2. The capacitor of claim 1 further comprising an oxide collar about an upper interior region of said trench.

3. The capacitor of claim 1 wherein said quantum conductive barrier layer is located at an interface between said trench electrode and said conductive strap.

4. The capacitor of claim 1 wherein said quantum conductive barrier layer is located at an interface between said conductive strap and said monocrystalline substrate.

5. The capacitor of claim 1 wherein said quantum conductive barrier layer is selected from the group consisting of silicon nitride, silicon oxynitride, alumina, germanium oxide and yttria-stabilized zirconia.

6. The capacitor of claim 1 wherein said quantum conductive barrier layer has a thickness of less than about 50 Å.

7. The capacitor of claim 1 wherein said quantum conductive barrier layer has a thickness of about 5–30 Å.

8. The capacitor of claim 3 wherein said quantum conductive barrier layer is substantially coextensive with said interface.

9. The capacitor of claim 4 wherein said quantum conductive barrier layer is substantially coextensive with said interface.

10. The capacitor of claim 1 wherein said conductive strap is a buried strap.

11. The capacitor of claim 1 wherein said conductive strap comprises amorphous silicon.

12. The capacitor of claim 1 wherein said trench electrode comprises doped polycrystalline silicon.

13. The capacitor of claim 1 wherein said monocrystalline semiconductor comprises undoped silicon or lightly doped silicon.

14. The capacitor of claim 3 further comprising an additional quantum conductive barrier layer located at an interface between said conductive strap and said monocrystalline substrate.

15. A method of forming a deep trench capacitor in a monocrystalline semiconductor substrate, said method comprising:

(a) providing a monocrystalline semiconductor substrate having (i) a buried plate about an exterior portion of trench in said substrate, (ii) a node dielectric about at least a lower interior portion of said trench, and (iii) an electrode in said trench, (b) removing an upper portion of said trench electrode to provide space for a conductive strap, thereby exposing electrode and substrate surface, (c) reacting said exposed surface of the electrode and the substrate about said space with a nitrogen compound to form a quantum conductive layer on said electrode and substrate surfaces, and (d) filling said space over said quantum conductive layer with a conductive strap material.

16. The method of claim 15 further comprising removing said quantum conductive layer from said trench electrode surface before step (d).

17. The method of claim 15 further comprising removing said quantum conductive material from said substrate surface before step (d).

18. The method of claim 15 wherein said nitrogen compound is selected from the group consisting of ammonia, NO, $N_2O$, and monatomic nitrogen.

19. The method of claim 15 wherein step (d) is performed at about 300–950° C.

20. The method of claim 16 wherein said removing comprises anisotropically etching said quantum conductive material from said trench electrode surface.

21. The method of claim 17 wherein said removing comprises forming a mask over said quantum conductive layer on said trench electrode surface, etching said quantum conductive material from said substrate surface, and removing said mask over said quantum conductive layer on said trench electrode surface.

22. The method of claim 15 wherein step (a) further comprises providing an oxide collar about an upper interior region of said trench, and step (b) further comprises removing a portion of said oxide collar.

23. The method of claim 15 wherein said reacting comprises contacting said surface with an atmosphere containing said nitrogen compound.

24. The method of claim 23 wherein said atmosphere contains a minor amount of oxygen.

25. The method of claim 23 wherein said atmosphere contains a gas selected from the group consisting of $N_2$, argon, helium, and mixtures thereof.

26. The method of claim 15 wherein said nitride layer has a thickness of less than about 50 Å.

27. The method of claim 16 wherein said nitride layer has a thickness of about 5–30 Å.

28. The method of claim 23 wherein said nitrogen compound has a partial pressure of about 1–760 torr.

29. The method of claim 15 further comprising etching said surface before reacting step (c).

30. The method of claim 15 wherein said surface is a silicon surface and said quantum conductive layer comprises silicon nitride.

31. A method of forming a deep trench capacitor in a monocrystalline semiconductor substrate, said method comprising:

(a) providing a monocrystalline semiconductor substrate having (i) a buried plate about an exterior portion of trench in said substrate, (ii) a node dielectric about at least a lower interior portion of said trench, and (iii) an electrode in said trench, (b) removing an upper portion of said trench electrode to provide space for a conductive strap, thereby exposing electrode and substrate surface, (c) forming a quantum conductive ceramic layer on said exposed surface of and said substrate about said space by chemical vapor deposition, physical vapor deposition or sputtering, and (d) filling said space over said quantum conductive layer with a conductive strap material.

* * * * *